United States Patent
Shim et al.

[11] Patent Number: 6,073,578
[45] Date of Patent: Jun. 13, 2000

[54] RF INDUCTION PLASMA SOURCE GENERATING APPARATUS

[75] Inventors: Kyu-Hwan Shim; Mun-Cheol Paek; Kyoung-Ik Cho, all of Taejon, Rep. of Korea

[73] Assignee: Electronics and Telecommunications Research Insitute, Taejon, Rep. of Korea

[21] Appl. No.: 09/205,617

[22] Filed: Dec. 4, 1998

[30] Foreign Application Priority Data

Oct. 9, 1998 [KR] Rep. of Korea ...................... 98-42335

[51] Int. Cl.[7] .................................................. C23C 16/00
[52] U.S. Cl. ................................ 118/723 I; 118/723 MP; 118/733; 422/186; 422/186.29
[58] Field of Search .............................. 422/186.29, 186; 118/733, 723 MP

[56] References Cited

U.S. PATENT DOCUMENTS

| | | |
|---|---|---|
| 4,268,711 | 5/1981 | Gurev . |
| 5,425,811 | 6/1995 | Mashita ............................. 118/723 MP |
| 5,478,400 | 12/1995 | Shimizu ................................... 118/733 |
| 5,574,958 | 11/1996 | Kawano ................................... 422/186 |
| 5,637,146 | 6/1997 | Chyi . |
| 5,651,825 | 7/1997 | Nakahigashi et al. . |
| 5,698,168 | 12/1997 | Priddy et al. ...................... 422/186.29 |

OTHER PUBLICATIONS

The effect of the III/V ratio and substrate temperature on the morphology and properties of GaN– and AlN–layers grown by molecular beam epitaxy on Si (111); M.A. Sanchez–Garcia, E. Calleja, E. Monroy, F.J. Sanchez, F. Calle, E. Munoz and R. Beresford; 1998; pp. 23–30.

Stimulated emission of 300K from photopumped GaN grown by plasma–assisted molecular beam epitaxy with an inductively coupled plasma source; O. Gluschenkov, J.M. Myoung, K.H. Shim, K. Kim, Z.G. Figen, J.Gao and J.G. Eden; Feb. 1997; pp. 811–813.

Evolution of Surface Morphology and Strain in Low–Temperature AlN Grown by Plasma–Assisted Molecular Beam Epitaxy; Kyu–Hwan Shim, Jaemin Myoung, Oleg Gluschenkov, Kyekyoon Kim, Chinkyo Kim and Ian K. Robinson; Mar. 1998; pp. L313–L315.

Characteristics of a mesh–bias–controlled electron cyclotron resonance plasma for the growth of gallium nitride epitaxial films; K. Yasui, K. Lizuka, and T. Akahane; Jan./Feb. 1998; pp. 369–374.

The energies of the GaN MBE reaction: a case study of meta–stable growth; N. Newman; 1997; pp. 102–112.

Primary Examiner—Thi Dang
Assistant Examiner—Rudy Zervigon
Attorney, Agent, or Firm—Antonelli, Terry, Stout & Kraus, LLP

[57] ABSTRACT

The object of the present invention is to provide a RF induction plasma source generating apparatus which generates a stabilized plasma and sustains the stabilized plasma by maintaining the plasma pressure from several hundreds Torr to several thousands Torr with attachment a buffer nozzle cap, upper metallic blocking films and lower metallic blocking films to a nozzle cap, plasma tube and RF induction coils, respectively for separating the plasma source generating apparatus from the chamber. To accomplish the object of the invention, the plasma source generating apparatus comprising PBN tube, RF induction coils, a nozzle, and a nozzle cap is characterized by a buffer nozzle cap for locating between the nozzle cap and the plasma tube and modulating the flow of the gas to modulate the difference between the chamber pressure and the plasma pressure; sealing films formed by sealing the lips of the buffer nozzle cap, the nozzle cap and the plasma tube for preventing the leakage of gas; and upper blocking films and lower blocking films for blocking the spread out of the RF electric field induced in the RF induction coils and converging the plasma source.

10 Claims, 4 Drawing Sheets

RF INDUCTION PLASMA SOURCE GENERATING APPARATUS

BACKGROUND OF THE INVENTION

1. Field of the Invention

The invention relates to a RF induction plasma source generating apparatus, and more specifically to a RF induction plasma source generating apparatus which generates a stabilized plasma and sustains the stabilized plasma by maintaining the plasma pressure from several hundreds Torr to several thousands Torr with attachment a buffer nozzle cap, upper metallic blocking films and lower metallic blocking films to a nozzle cap, plasma tube and RF induction coils, respectively for separating the plasma source generating apparatus from the chamber.

2. Description of the Prior Art

Generally, group III-V nitride compound semiconductors have been studied over recent 8 years as they are superior to other than semiconductor materials. Of the epitaxial growth technologies for epitaxially growing the group III-V nitride, researches have been developed which realize the benefits of ultra high vacuum molecular beam epitaxy capable of epitaxially growing with accuracy amounting to several atomic layer by heterogeneous junction of multi-epitaxial layer.

However, $N_2$ gas does not react with other materials, a plasma source is necessary to decompose this gas and introduce an atomic nitrogen. The conventional plasma source generating apparatus is similar to FIG. 1, but without grid electrode. The apparatus has been often used in plasma assisted molecular beam epitaxy (PAMBE) growth of GaN type compound semiconductors, and the content of which is described in the preceding patents and articles.

The preceding patents are as follows:

U.S. Pat. No. 5,637,146 published on Jun. 10, 1997 and entitled "Method for the growth of nitride based semiconductors and its apparatus"; U.S. Pat. No. 4,268,711 published on May 19, 1991 and entitled "Method and apparatus for forming films from vapors using a contained plasma source"; and U.S. Pat. No. 5,651,825 published on Jan. 29, 1997 and entitled "Plasma generating apparatus and plasma processing apparatus".

The preceding article is the article entitled "The effect of the III/V ratio and substrate temperature on the morphology and properties on GaN- and AIN-layers grown by molecular beam epitaxy on Si(111)" by M. A. Sanchez-Garcia, et. al., J. Crystal Growth (183, 23), 1998.

However, PAMBE growth of GaN is not so successful in view of the application of device. As a this cause, various situations may be considered but principally resulting from the defects in the surface of the substrate by the kinetic energy of the ion created by plasma potential.

The energy of ion has the distribution with Full-Width at Half maximum (FWHM) being corresponding to about 5 eV, and can has the distribution having the average energy amounting to 2–3 eV at minimum to 30 eV at maximum depending on the flow rate of the used $N_2$ gas and the supplied RF power. In the conditions of RF plasma mainly used in the epitaxial growth, since the ions which arrive at the substrate spaced 15 cm apart from them amount to about $10^{12}$ cm$^{-2}$ s$^{-1}$, even when the possibility of the defect creation is 0.1% in case of the epitaxial growth in the growth rate of 100 nm/hr, the defect corresponding to the density of $10^{17}$ cm$^{-3}$ is created. This density defect greatly degrades the quality of the epitaxial layer.

In view of avoiding the above-mentioned problem, various methods have been proposed.

One of the methods is a method wherein the ions are removed the outside by application of the electric field. This method is described in the article entitled "The energetics of the GaN MBE reaction: a case of meta-stable growth", by N. Newman, J. Cryatal Growth (178, 102, 1997).

FIG. 1 is a cross-sectional view of the prior art plasma source generating apparatus adopting this method.

As shown in FIG. 1, the prior art plasma source generating apparatus is comprised of plasma tube 1, nozzle 2, RF induction coils 3, a grid electrode 4 placed on the top of the nozzle 2, and a power source 5 for supplying a voltage Vg to the grid electrode.

Now, the operations of the thus constructed plasma source generating apparatus will be briefly explained. When the grid electrode 4 placed on the top of the nozzle 2 is supplied with the voltage Vg by the power source 5, the ions of plasma source being sprayed through the nozzle 2 are removed in dot arrow shown in FIG. 1 via the grid electrode 4.

Such a prior art plasma source generating apparatus has a merit that the presence of ions can be controlled by the voltage applied to the grid electrode 4 and charge particles such as electrons can be removed.

However, the prior art plasma source generating apparatus requires a additional power source for supplying the voltage of 300 V or more to substantially removing the ions arriving at the substrate and causes the sputtering phenomenons with the ions accelerated by the voltage being impinged on the chamber around the grid electrode or the cooling device, thereby the impurities being transferred to the substrate, eventually degrading the quality of the epitaxial layer. And, the prior art plasma source generating apparatus has disadvantage in that the gases and particles passing through the nozzle of the predetermined size or more have the shape being spreaded out outside of the nozzle by the wide angle of the motion direction, thereby reducing the density of the ions arriving at the substrate.

FIG. 2 is a cross-sectional view of the prior art plasma source generating apparatus provided with fine nozzles having the size of 0.5 mm and less.

As shown in FIG. 2, the prior art plasma source generating apparatus is comprised of a plasma tube 10, fine nozzles 11, and RF induction coils 12.

The thus constructed plasma source generating apparatus utilizes the principle wherein the apertures of fine nozzles 11 serve as a high plasma potential barrier with this apparatus being provided with fine nozzles 11 of several hundreds, in order for the ions not escaping outside of nozzles.

This principle is described in the article entitled "Characteristics of a mesh-bias-controlled electron cyclotron resonance plasma for the growth of gallium nitride of epitaxial films", by K. Yasui, et al, J. Vac. Sci. Technol. (A16, 369, 1998).

However, such a prior art plasma source generating apparatus has a problem in that the plasma potential barrier is still not perfect. And, it is considered that the prior art plasma source generating apparatus has a high cost and the low efficiency in preventing ions from escaping in case of producing the nozzle of 0.5 mm size according to a laser process. Therefore, if the diameter of fine nozzle in PBN (Pyrolitic Boron Nitride) tube is less than 0.5 mm, the efficiency of preventing ions from escaping slightly becomes high, but there are limitations in producing fine nozzles of several thousands. Also, since the electric field may be transferred outside near nozzle of the PBN tube when RF power is high, the object of removing the ion cannot be accomplished

SUMMARY OF THE INVENTION

Therefore, the present invention has been made in view of the abovementioned problems, it is an object of the present invention to provide a RF induction plasma source generating apparatus which generates a stabilized plasma and sustains the stabilized plasma by maintaining the plasma pressure from several hundreds Torr to several thousands Torr with attachment a buffer nozzle cap, upper metallic blocking films and lower metallic blocking films to a nozzle cap, plasma tube and RF induction coils, respectively for separating the plasma source generating apparatus from the chamber.

BRIEF DESCRIPTION OF THE DRAWINGS

The above object and other objects and aspects of the invention will become apparent from the following description of embodiments with reference to the accompanying drawings in which.

DESCRIPTION OF THE PREFERRED EMBODIMENTS

The object, characteristics and advantages of the present invention will be more clearly understood through the preferable embodiments referring to the attached drawings.

In order to accomplish the object, in accordance with the invention, a RF induction plasma source generating apparatus is provided which comprises PBN tube for supplying gas to a plasma tube, RF induction coils for forming the supplied gas as a plasma source by inducing RF electric field, a nozzle for spraying the plasma source formed in the plasma tube, and a nozzle cap, further comprising:

a buffer nozzle cap for locating between the nozzle cap and the plasma tube and modulating the flow of the gas to modulate the difference between the chamber pressure and the plasma pressure;

sealing films formed by sealing the lips of the buffer nozzle cap, the nozzle cap and the plasma tube for preventing the leakage of gas; and upper blocking films and lower blocking films for blocking the spread out of the RF electric field induced in the RF induction coils and converging the plasma source.

Figure 1:
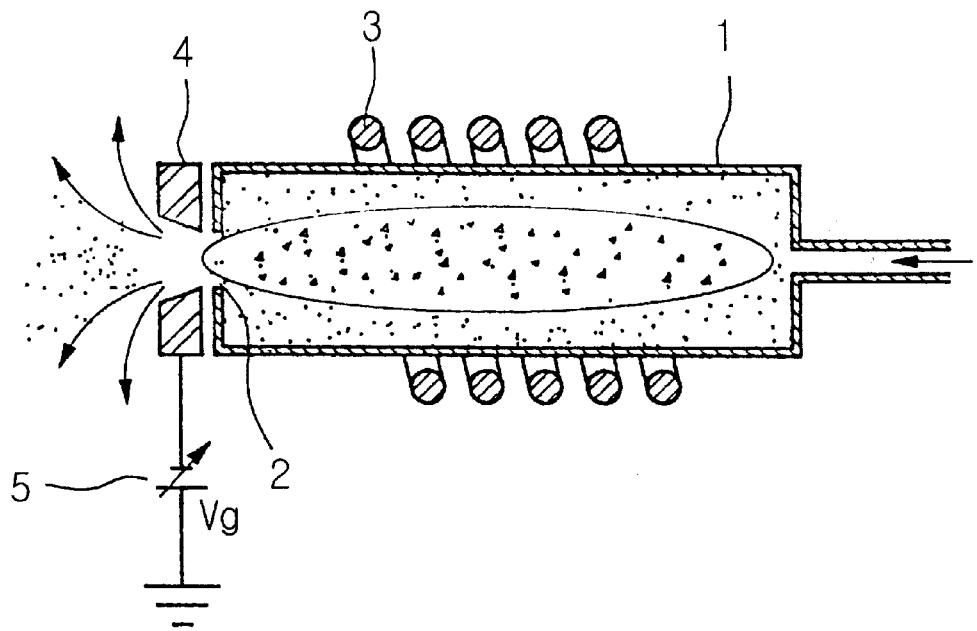
FIG. 1 is a cross-sectional view of the prior art plasma source generating apparatus provided with a grid electrode.
Figure 2:
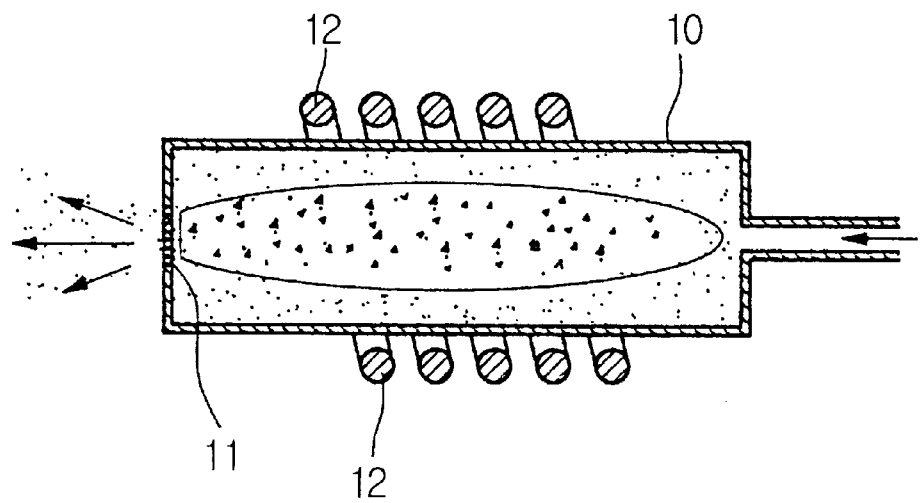
FIG. 2 is a cross-sectional view of the prior art plasma source generating apparatus provided with fine nozzles.
Figure 3:
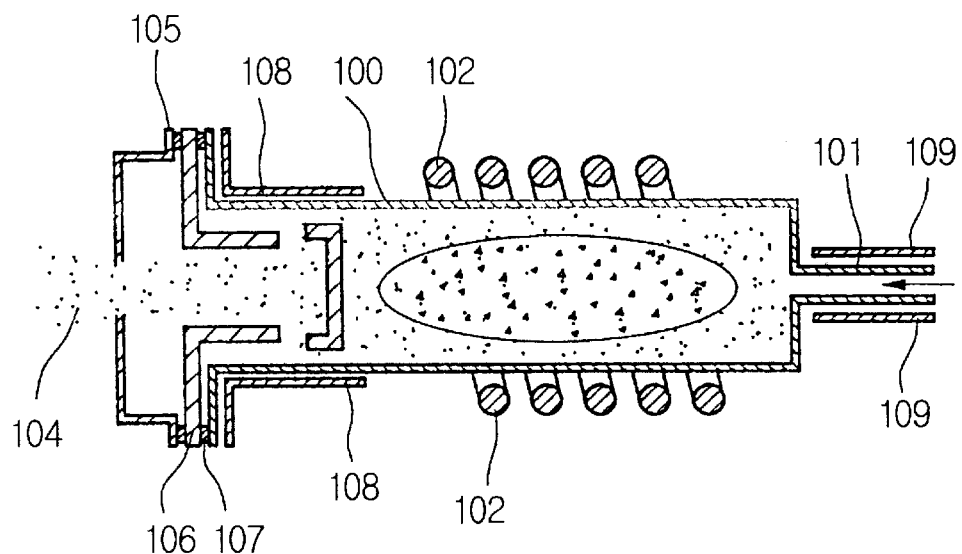
FIG. 3 is a cross-sectional view of a RF induction plasma source generating apparatus according to one embodiment of the present invention.

FIG. 3 is a cross-sectional view of RF induction plasma source generating apparatus in accordance with one embodiment of the invention.

As shown in FIG. 3, the RF induction plasma source generating apparatus in accordance with one embodiment of the invention comprises PBN tube 101 for supplying gas a plasma tube 100, a RF induction coil 102 for inducing RF electric field and forming the supplied gas as a plasma source, a nozzle 104 for spraying the plasma source formed in the plasma tube, and a nozzle cap 105, a buffer nozzle cap 106 for locating between the nozzle cap 105 and the plasma tube 100 and modulating the flow of the gas to modulate the difference between the chamber pressure and the plasma pressure (Pp), sealing films 107 formed by sealing the lips of the buffer nozzle cap 106, the nozzle cap 105 and the plasma tube 100 for preventing the leakage of gas, and upper blocking films 108 and lower blocking films 109 for blocking the spread out of the RF electric field induced in the RF induction coils 102 and converging the plasma source.

Figure 4:
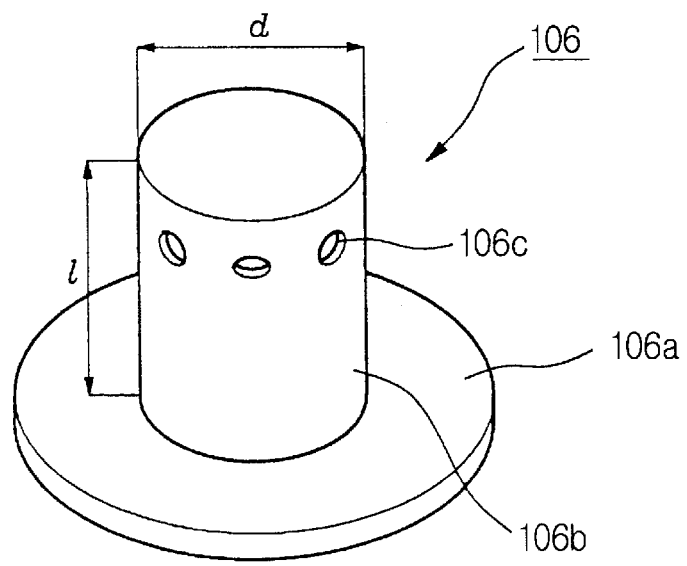
FIG. 4 is a detailed structure of the buffer nozzle cap shown in FIG. 3.

As shown in FIG. 4, the buffer nozzle cap 106 comprises lip 106a formed of a circular plate and tube 106b having the length of I and the diameter of d with its top towards the plasma tube 100 being closed and its bottom being coupled with the center of the lip 106a. The predetermined location of the top of the tube 106b is asymmetrically provided with nozzles 106c.

Figure 5A:
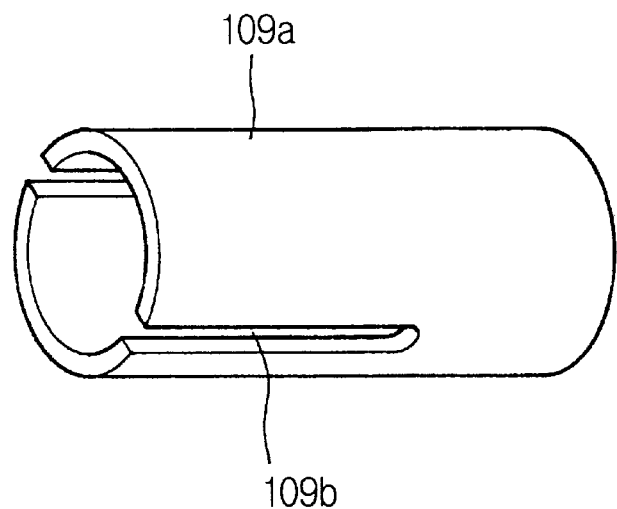
FIG. 5a is a detailed structure of the upper metallic blocking films shown in FIG. 3.

As shown in FIG. 5a, the metallic blocking films 108 comprises the a lip 108a formed of a circular plate and tube 108c provided with slits 108b in the both sides with its top being opening and its bottom being coupled with the center of the lip 108a. The slits 108b prevent the current induced by RF electric field of the RF induction coils 102. The metallic blocking 108 is located in the direction of the RF induction coils 102 by a predetermined length longer than the buffer nozzle cap 106 for separating the converging plasma from the buffer nozzle cap. The metallic blocking films 108 are formed of metal type having a melting point such as tantalum and molybdenum so as to maintain the outgassing at minimum even when this films are used in a high temperature.

Figure 5B:
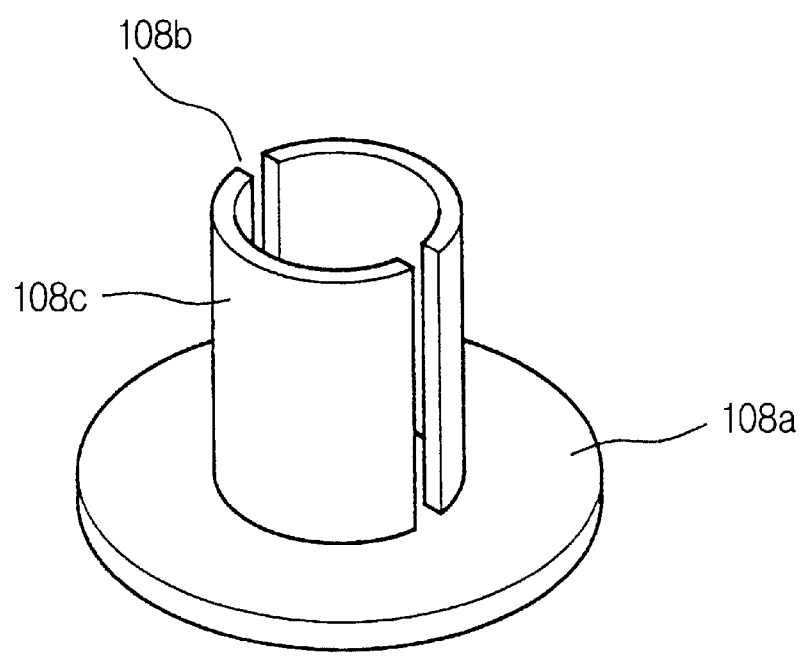
FIG. 5b is a detailed structure of the lower metallic blocking films shown in FIG. 3.

As shown in FIG. 5b, the lower metallic blocking films 109 comprises a cylindrical tube 109a with its both ends being opened and slits 109b formed in the both sides of the tube 109a by a predetermined length from the one end of the tube 109a. The slits 109b prevent the current induced by RF electric field of the RF induction coils 102. The lower metallic blocking films 109 are formed of metal type having a high melting point such as tantalum and molybdenum so as to maintain the outgassing at minimum even when this films are used in a high temperature.

The operations of RF plasma source generating apparatus thus constructed according to the embodiment of the invention will be explained.

First, the efficiency of plasma is very important in increasing the epitaxial growth rate, it is difficult to precisely expect or measure the decomposition efficiency of molecules in $N_2$ plasma. As the plasma pressure is increased from 10 mTorr to 400 mTorr, the molecular density is increased while the average energy of the electron present in plasma is reduced from 3 eV to 1 eV, it is noted that a certain pressure condition exhibiting the optimized efficiency exits. The density of the electron is dramatically increased at 30 mTorr or more, but is not greatly varied at 80 mTorr or more. The atomic amount ($N_{atom}$) created in plasma shows the relationship of $N_{atom} (P_{RF})^{1/2}$ f (J, Pp), as a function of pressure (Pp), the flow rate of gas (J) and RF power ($P_{RF}$). Here, wherein f (J, Pp) shows that the flow rate of gas and the plasma pressure are functionally related to each other. As the scattering cross-sectional area of molecule is greatly increased at 10 eV or more depending on the energy of the electron for $N_2$ plasma, the function f (J, Pp) is peaked around 30–60 mTorr, is dramatically reduced at 30–60 mTorr and less, and is slowly reduced at 30–60 mTorr or more. Accordingly, the supplying density of the atom is the most proper around the pressure of 50 mTorr, and is increased with the ½ exponential function depending on the supplied RF power ($P_{RF}$). The size of the nozzle 104 shown in FIG. 3 is designed in such a manner that the plasma pressure (Pp) can be modulated to 30–100 mTorr.

In FIG. 3, the plasma tube 100 is formed with its length being about 3 cm and its diameter being about 20 cm to have the proper plasma shape, RF induction coils 102 is formed of the high purity of copper pipe, the inside of thereof flows the cooling water. The nozzle 104 located in the outmost of the plasma source generating apparatus is formed with its diameter being 3–5 mm and having a value similar to the diameter of the buffer nozzle cap 106 in inside of the apparatus. The PBN tube 101 supplies gas to the plasma tube 100 and has its diameter of 2–7 mm such that a improper distribution according to the spread out of the plasma may be possibly prevented.

The sealing films 107 in FIG. 3 is formed by sealing the lips of the nozzle cap 105, the buffer nozzle cap 106 and the plasma tube 100 to prevent the leakage of gas due to the pressure difference. Since the temperature of the said members increases to 1000° C., the sealing films 107 need to stabilize in a high temperature, must not be etched by reaction with gas and must be shocked due to the change of temperature because of the difference of coefficients of their thermal expansion being low. It may be considered that there is still no material suitable for the sealing films. Therefore, in accordance with the embodiment of the present invention, said members are bonded with each other by coating the lips of said members with metal type such as Al, Ga and In, and thermal processing said members in a connected state in a high temperature furnace. In this condition, the furnace is maintained at the temperature of 700–900° C. and includes $NH_3$ atmosphere. In the furnace, the $NH_3$ gas reacts with the metal for a few hours thereby to form nitride thin films such as AlN, GaN, InN. These nitride thin films have the excellent sealing effect because of very eminent adhesion with said members as well as the outstanding stability in a high temperature. Since these nitride thin films are composed of nitride, the implantation possibility of the impurity is substantially excluded in generating the commonly used $N_2$ plasma.

The buffer nozzle cap 106 in shown FIG. 4 is made of PBN. The cap has tube 106b with its top being closed and its length being I and its diameter being d. A predetermined location of the top of the tube 106b is asymmetrically provided with nozzles 106c.

The flow of gas and the difference between the chamber pressure and the plasma pressure (Pp) is modulated by the buffer nozzle cap 106, resulting in blocking the ions passing through in a straight line. Since the plasma source generating apparatus is separated by the buffer nozzle cap 106 from the chamber maintained at the pressure of $10_{-5}$ Torr and less, the plasma pressure (Pp) is maintained at the pressure of several tens mTorr to generate a stabilized plasma. Since this high plasma pressure (Pp) causes a high density plasma, the disassociation effect of gas is high. And, the chamber pressure of a relatively low provides a low load to a pump system, increases the arrival possibility of the supplied molecular or atomic beam arriving at a wafer without impinging, and increases the modulation functions with the surface reaction being created in the surface of the wafer according to the ideal mechanism of MBE. The ions passing through the nozzles 106c of the buffer nozzle cap 106 impinge at least once on the walls said members made of PBN. At this time, the ions return to the neutral state with the exchange of charges being generated and electrons being supplied. In this process, the potential energies or kinetic energies having the ions are extinct to be supplied with the low energy particles only having thermal energy of 0.5 eV and less.

Since the tube 106b of the buffer nozzle cap 106 in shown FIG. 4 is elongated for preventing the generation of the high density plasma, the flow of gas is mainly switched in the direction of the nozzles 106c, and hence the gas density arriving at the substrate is enhanced because of having a high straight even when the gas passes through the nozzles 106c. As described in the above, the nozzles 106c of the buffer nozzle cap 106 modulates the difference between the plasma pressure (Pp) and the chamber pressure. When $N_2$ gas is supplied at the flow rate of 0.5–10 sccm, the chamber pressure becomes from $2 \times 10_{-5}$ Torr to $4 \times 10^{-4}$ Torr. In epitaxial growth, the background pressure is high for the flow rate of 10 sccm and the background vacuum is low for the flow rate of 0.5 sccm and less. Thus, the influence of the background pressure affecting on the epitaxial growth can be reduced, and simultaneously all kinds of vacuum gauges and lifetime of filaments such as substrate heater and source cell heater used in the chamber can be longer maintained. If the total area of the nozzles 106c is equal to the circular area having diameter of 3 mm, the plasma pressure is maintained at the pressure of 30–600 mTorr for the $N_2$ flow rate of the 0.5–10 sccm. Therefore, when RF induction plasma source generating apparatus according to the embodiment of the invention is used, a stabilized plasma can be obtained even for the flow rate of 0.5 ssccm and less and also the plasma beam of high flow rate density can be supplied to wafer in low background pressure.

The upper metallic films 108 and lower metallic films 109 in shown FIG. 5a and FIG. 5b block the spread out of electric field and converge plasma. The upper metallic films 108 is located in direction of the RF induction coils 102 about 1 cm longer than the buffer nozzle cap 106 for separating the converging plasma from the buffer nozzle cap 106. The upper metallic films 108 and lower metallic films 109 are formed by processing the metal type such as tantalum or molybdenum having a high melting point so that even when used in the high temperature 1000° C., the outgassing can be maintained at minimum. Slits 108b of the upper metallic films 108 and slits 109b of the lower metallic films 109 are formed with their lengths being over 2 mm for preventing the induction current induced by RF electric field. One advantage of plasma source generating apparatus which operates in a induction manner is to easily produce it, and its usage is convenient. By the upper metallic films 108 and lower metallic films 109 preventing the electric fields created in the upper portion and lower portion of the plasma source generating apparatus, the efficiency of constraining plasma in a confined area can be enhanced, the apparatus can be downsizing, and RF power consumption can be reduced.

Figure 6:
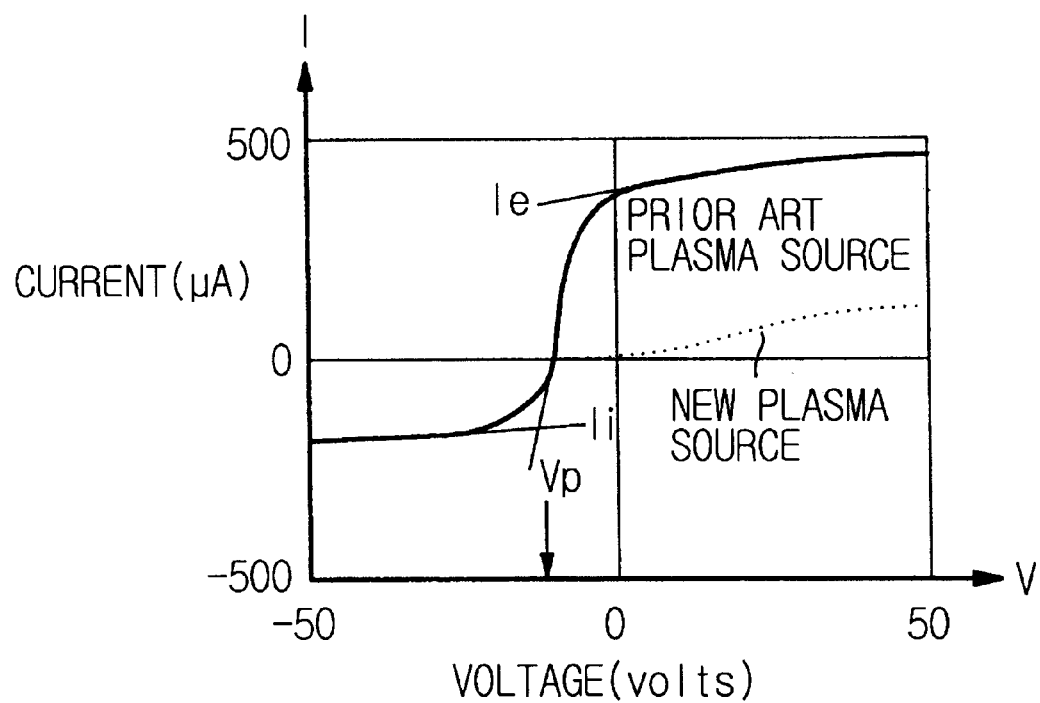
FIG. 6 is a graph showing I–V characteristics by the charge particles such as electrons, and the ions supplied from the prior art plasma source generating apparatus and plasma source generating apparatus according to the present invention.

FIG. 6 is a graph showing I–V characteristics by the charge particles such as electrons, and the ions supplied from the prior art plasma source generating apparatus and the plasma source generating apparatus according to the present invention.

By providing a Langmuir probe in location about 10 cm apart from the outside of the nozzle 104, the current by the arriving ion and electron with application of DC voltage can be measured. The problems of radio wave or shorting can be overcome by serially connecting RF choke and a resistor of 10 kohm or more between a Langmuir probe and power supply.

As shown in FIG. 6, the prior art plasma source generating apparatus shows I-V plasma curve by a typical plasma Langmuir probe. Here, The current ($I_i$) by ion is mainly detected for minus voltages, while the current ($I_e$) by electron is mainly detected for plus voltages. And, the prior art apparatus shows a typical characteristic curve in which the supplied voltage causes transition near 0V. As in the graph, it is natural that the electrons rather than the ions are entirely converged for the electron characteristic. The average energy of ion can be measured by obtaining the plasma potential ($V_p$) from this characteristic curve.

In contrast the characteristic curve of the prior art plasma source generating apparatus, in the plasma source generating apparatus according to the embodiment of the invention, the I-V characteristic curve appears as a dot line which the amount of ion is greatly reduced. As in the dotted curve, since the amount of electron is reduced but are easily moved rather than the ion, it can be seen that a large of the electrons are supplied outside because of the electrons supplied to the plasma source generating apparatus being substantial.

The present invention has the following effects:

Firstly, the invention may be advantageously used for growing GaN type nitride compound semiconductors in the ultra-high vacuum MBE system.

Secondly, the invention can eliminate the creation possibility of defects under several atomic layers in the epitaxial surface for crystalline growth, with the particles of high energy arriving at the substrate being converted to the particles of low energy.

Thirdly, since the background pressure of MBE chamber can be maintained at low for epitaxial growth, the invention can stably use high reactive gas such as $O_2$, $H_2$ and $NH_3$ as well as $N_2$.

Fourthly, the invention can be utilized for oxide semiconductors as well as nitride semiconductors, and also can be utilized for growth of various kinds of epitaxial layers and simultaneously for the hydrogenization of the epitaxial layer on the substrate by supply of atomic hydrogen and the application for modulating the surface reaction mechanism.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A RF induction plasma source generating apparatus including a PBN tube for supplying gas a plasma tube, a RF induction coil for inducing RF electric field and forming the gas supplied to said the plasma tube as a plasma source, a nozzle for spraying the plasma source formed in said plasma tube, and a nozzle cap, comprising:

a buffer nozzle cap for locating between said nozzle cap and said plasma tube and modulating the flow of the gas to modulate the difference between the chamber pressure and the plasma pressure;

sealing films formed by sealing the lips of said buffer nozzle cap, said nozzle cap and said plasma tube for protecting the leakage of gas; and upper blocking films and lower blocking films for blocking the spread out of the RF electric field induced by said the RF induction coils and converging said plasma source.

2. A RF induction plasma source generating apparatus as set forth in claim 1, wherein said buffer nozzle cap comprises a lip formed with circular plate; and a tube having a predetermined length and a predetermined diameter, the top toward said plasma tube of said tube being closed and the bottom being coupled with the center of said lip.

3. A RF induction plasma source generating apparatus as set forth in claim 2, a plurality of nozzles are asymmetrically formed in a predetermined location of the top of said tube.

4. A RF induction plasma source generating apparatus as set forth in claim 1, wherein said sealing films are formed by coating the lips of said buffer nozzle cap, said nozzle, and said plasma tube with metal type such as Al, Ga and In, and thermal processing said members in a connected state in a high temperature furnace thereby to bond with each other.

5. A RF induction plasma source generating apparatus as set forth in claim 4, wherein said sealing films are formed of nitride thin films such as AlN, GaN, InN by causing said high temperature furnace to be maintained at the temperature of 700–900° C., the atmosphere of said high temperature furnace to be $NH_3$ gas, and said $NH_3$ gas to be reacted with said metal for a few hours.

6. A RF induction plasma source generating apparatus as set forth in claim 1, wherein said upper metallic blocking films comprises a lip of a circular plate and a tube provided with slits in both side, the top of said tube being opened and the bottom being coupled with the center of said lip.

7. A RF induction plasma source generating apparatus as set forth in claim 1, wherein said upper metallic blocking films are located in direction of said RF induction coils by a predetermined length longer than said buffer nozzle cap in order for separating the converging plasma from said buffer nozzle cap.

8. A RF induction plasma source generating apparatus as set forth in claim 1, wherein said lower metallic blocking films comprises a cylindrical tube formed with the both sides thereof being opened; and slits formed in said both sides in a predetermined length from one side of said tube.

9. A RF induction plasma source generating apparatus as set forth in claims 6, wherein said slits prevent the current from inducing by RF electric field of said RF induction coils.

10. A RF induction plasma source generating apparatus as set forth in claims 6, wherein said upper metallic films and said lower metallic films are formed with metal type such as tantalum or molybdenum having a high melting point so that even when used in a high temperature, the outgassing is sustained at minimum.

* * * * *